US009245883B1

(12) United States Patent
Lin et al.

(10) Patent No.: US 9,245,883 B1
(45) Date of Patent: Jan. 26, 2016

(54) METHOD OF MAKING A FINFET DEVICE

(71) Applicant: Taiwan Semiconductor Manufacturing Company, Ltd., Hsin-Chu (TW)

(72) Inventors: Chih-Han Lin, Hsinchu (TW); Jr-Jung Lin, Hsinchu (TW); Ming-Ching Chang, Hsinchu (TW); Chao-Cheng Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/502,550

(22) Filed: Sep. 30, 2014

(51) Int. Cl.
| H01L 21/311 | (2006.01) |
| H01L 27/088 | (2006.01) |
| H01L 29/06 | (2006.01) |
| H01L 21/8234 | (2006.01) |
| H01L 21/762 | (2006.01) |
| H01L 21/3213 | (2006.01) |
| H01L 29/66 | (2006.01) |
| H01L 21/3105 | (2006.01) |

(52) U.S. Cl.
CPC ...... *H01L 27/0886* (2013.01); *H01L 21/31055* (2013.01); *H01L 21/32133* (2013.01); *H01L 21/762* (2013.01); *H01L 21/823431* (2013.01); *H01L 21/823437* (2013.01); *H01L 21/823481* (2013.01); *H01L 29/0649* (2013.01); *H01L 29/6656* (2013.01); *H01L 29/6681* (2013.01)

(58) Field of Classification Search
CPC ............... H01L 21/823425; H01L 21/823821; H01L 21/845; H01L 27/0886; H01L 27/0924; H01L 27/10826
USPC .................. 257/283, 400, 595, 596, 696, 700
See application file for complete search history.

(56) References Cited

U.S. PATENT DOCUMENTS

| 8,753,970 | B2 * | 6/2014 | Xie et al. | 438/595 |
| 9,034,748 | B2 * | 5/2015 | Baiocco et al. | 438/595 |
| 9,064,890 | B1 * | 6/2015 | Xie et al. | |

* cited by examiner

*Primary Examiner* — Tan N Tran
(74) *Attorney, Agent, or Firm* — Haynes and Boone, LLP

(57) ABSTRACT

A method of fabricating a fin-like field-effect transistor (FinFET) device is disclosed. The method includes forming a first gate stack and a second gate stack over different portions of a fin feature formed on a substrate, forming a first dielectric layer in a space between the first and second gat stacks, removing the first gate stack to form a first gate trench, therefore the first gate trench exposes a portion of the fin feature. The method also includes removing the exposed portion of the fin feature and forming an isolation feature in the first gate trench.

11 Claims, 24 Drawing Sheets

METHOD OF MAKING A FINFET DEVICE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, a more flexible integration for forming fin cut is desired.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 13 to 16A are diagrammatic perspective views of an example FinFET device in accordance with some embodiments.

DETAILED DESCRIPTION

Figure 1:
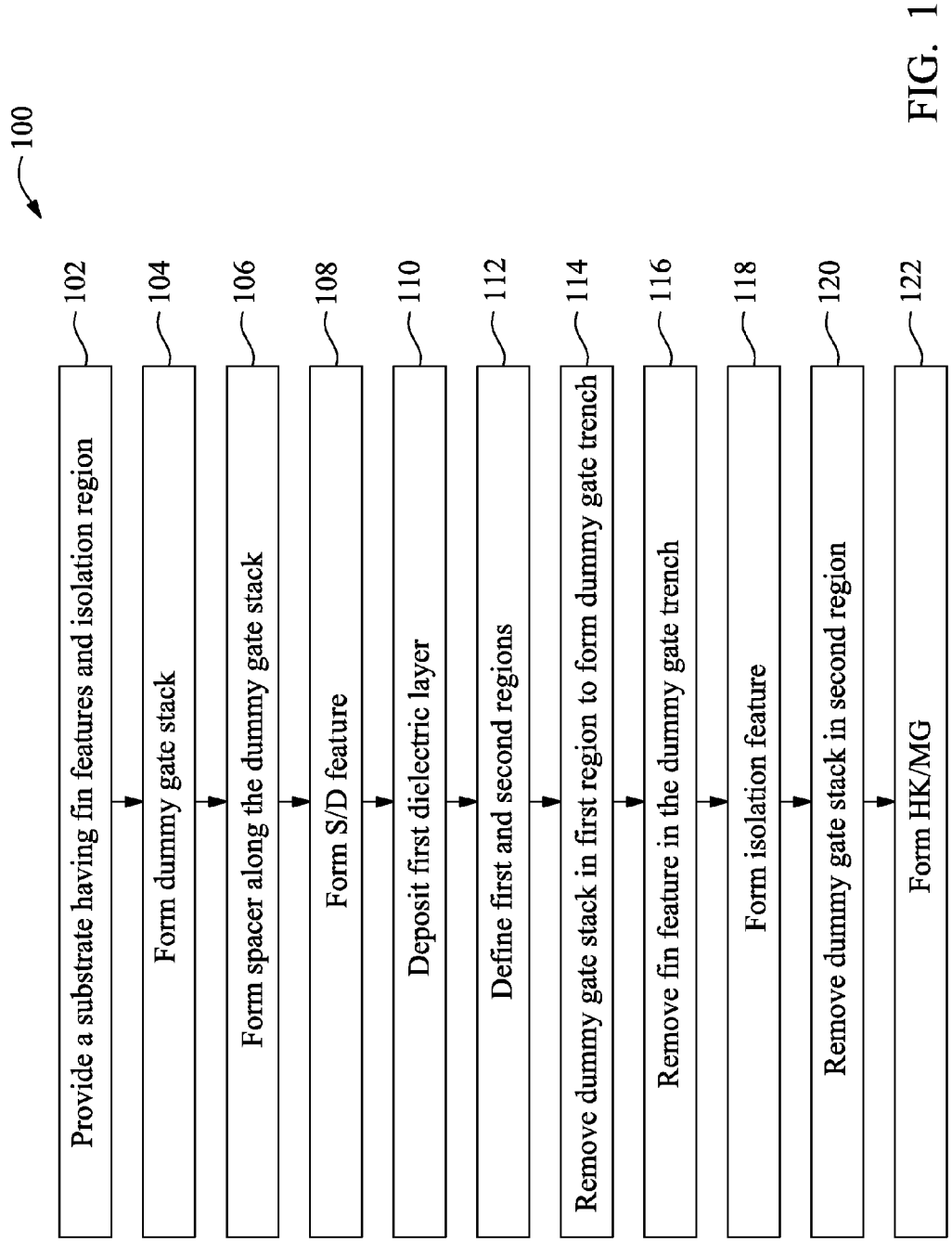
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 in accordance with some embodiments. It is understood that additional steps may be implemented before, during, and after the method, and some of the steps described may be replaced or eliminated for other embodiments of the method. The FinFET device 200 and the method 1000 making the same are collectively described with reference to various figures.

Figure 2A:
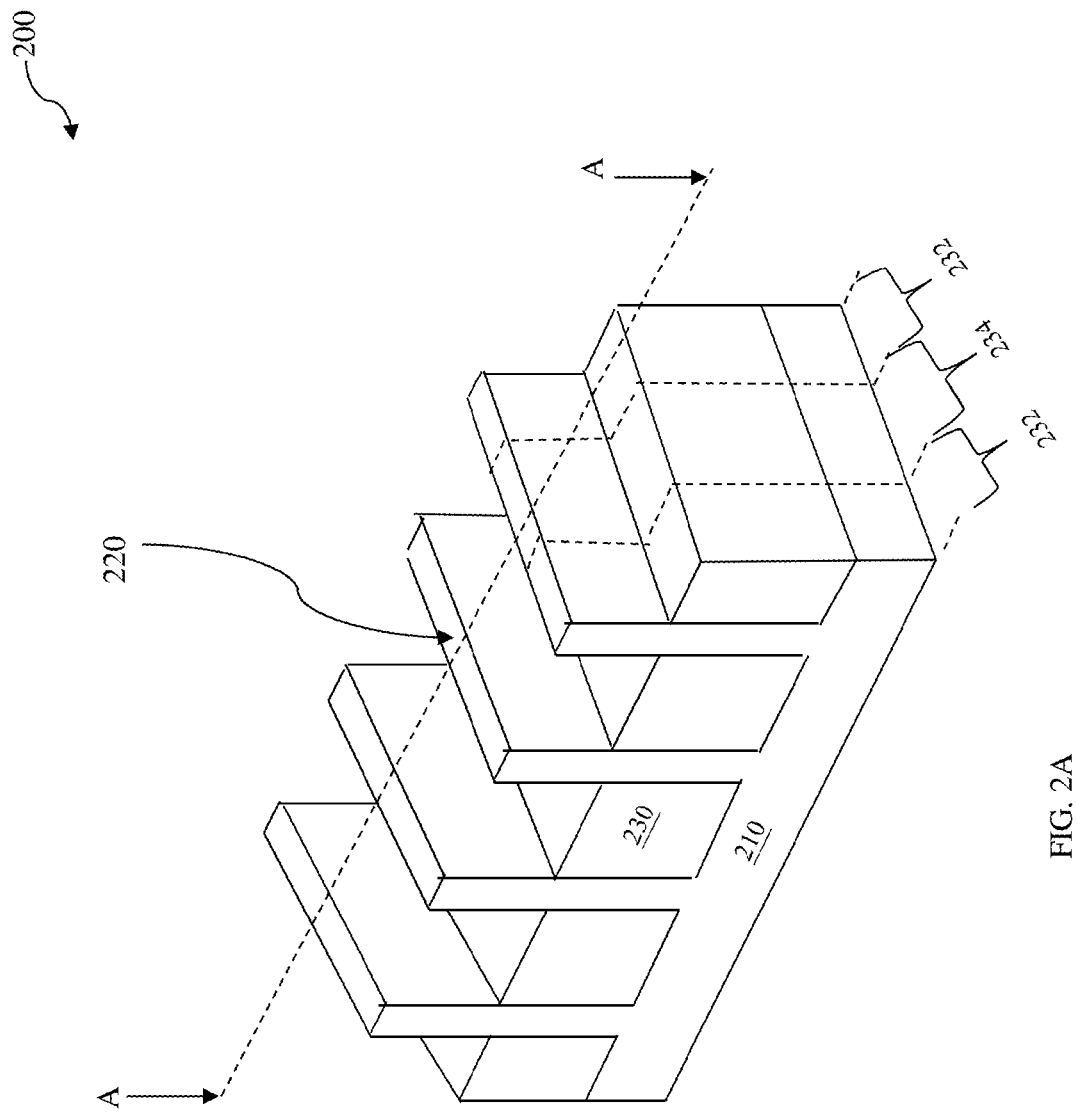
FIG. 2A is a diagrammatic perspective view of an example FinFET device in accordance with some embodiments
Figure 2B:
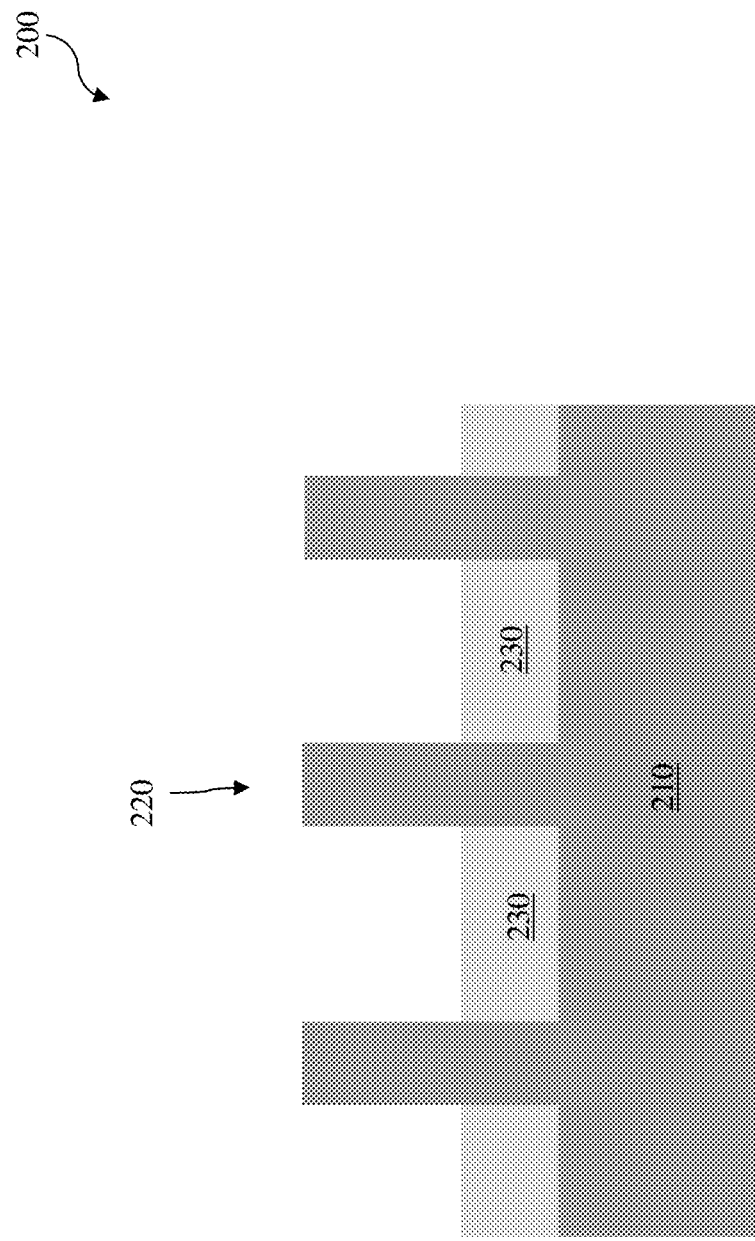
FIG. 2B is a cross-sectional view of an example semiconductor device along the line A-A in FIG. 2A

Referring to FIGS. 1 and 2A-2B, the method 100 begins at step 102 by providing a substrate 210 having a plurality of fin features 220 and isolation region 230. Substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors 200, the insulator layer is a component (e.g., layer) of a silicon-on-insulator substrate.

The substrate 210 may also include various doped regions. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

A plurality of fin feature 220 is formed on the substrate 210. Referring to FIG. 2A, a height of the fin feature 220 is along Z direction while its length along Y direction. The fin features 220 are formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the substrate 210. The area not protected by the masking element is etched using reactive ion etching (RIE) processes and/or other suitable processes. In an example, the fin features 220 are formed by patterning and etching a portion of the silicon substrate 210. In another example, the fin features 220 are formed by patterning and etching a silicon layer deposited overlying an insulator layer (for example, an upper silicon layer of a silicon-insulator-silicon stack of an SOI substrate.

Various isolation regions 230 are formed on the substrate 210 to isolate active regions. For example, the isolation regions 230 separate fin features 220. The isolation region 230 may be formed using traditional isolation technology, such as shallow trench isolation (STI), to define and electrically isolate the various regions. The isolation region 230 includes silicon oxide, silicon nitride, silicon oxynitride, an air gap, other suitable materials, or combinations thereof. The isolation region 230 is formed by any suitable process. As one example, the isolation region 230 is formed by depositing an isolation layer over the substrate 210 and recessing a portion of the isolation layer to form the isolation region 230 and expose an upper portion of the fin feature 220.

In some embodiments, the substrate 210 has source/drain regions (S/D) 232 and a gate region 234. In some embodiments, a S/D 232 is a source region, and another S/D region 232 is a drain region. The S/D 232 are separated by the gate region 234.

Figure 3A:
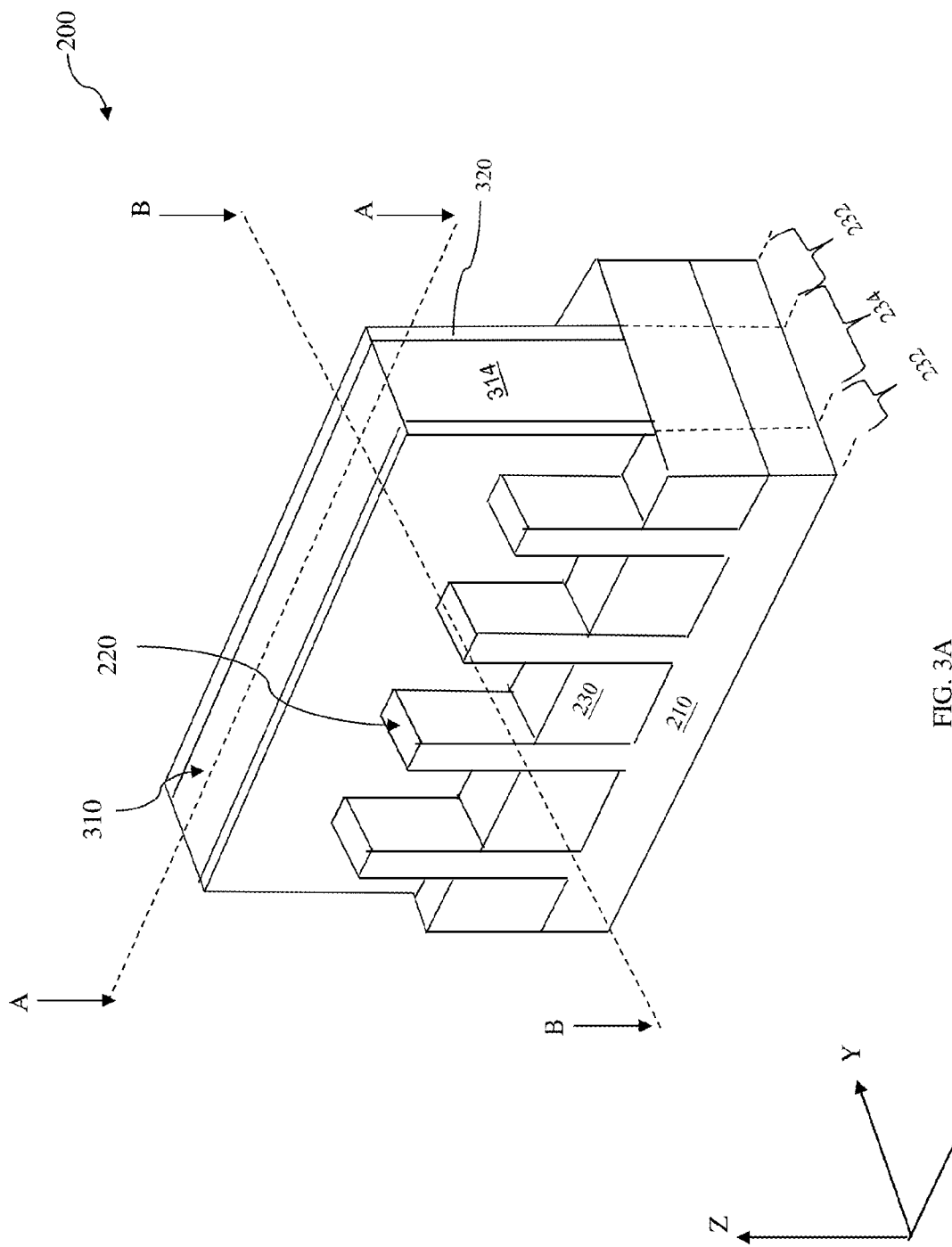
FIG. 3A is a diagrammatic perspective view of an example FinFET device in accordance with some embodiments
Figure 3B:
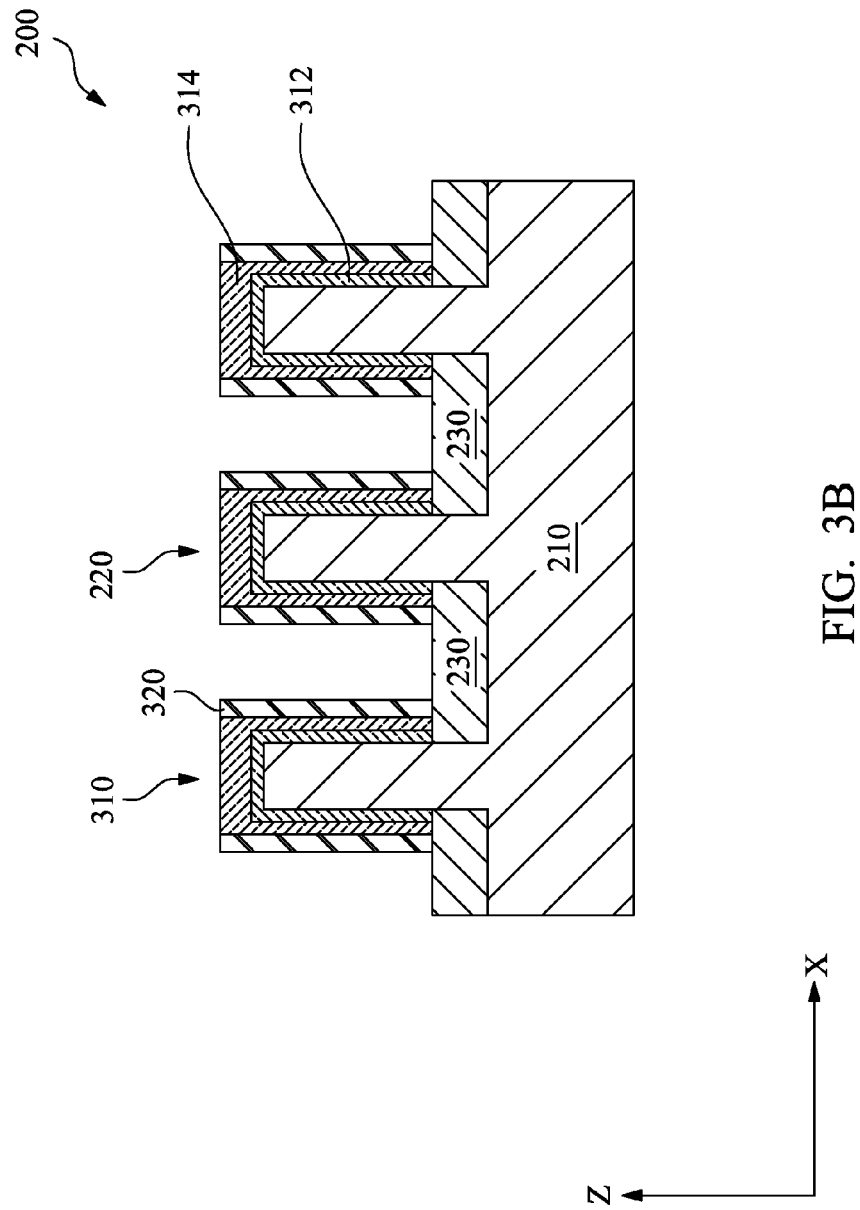
FIG. 3B is a cross-sectional view of an example semiconductor device along the line A-A in FIG. 3A.

Referring to FIGS. 1 and 3A-3B, the method 100 proceeds to step 104 by forming first gate stacks 310 over the substrate 210, including wrapping over the upper portion of fin feature 220. In one embodiment, the first gate stack 310 includes a dummy gate stack and it will be replaced by a final gate stack at a subsequent stage. Particularly, the dummy gate stack 310 is to be replaced later by a high-k dielectric/metal gate (HK/MG) after high thermal temperature processes, such as thermal annealing for source/drain activation during the sources/drains formation. In one embodiment, the dummy gate stack 310 includes a dummy dielectric layer 312 and polycrystalline silicon (polysilicon) 314. The the dummy gate stack 310 may be formed by a suitable procedure including deposition, lithography patterning and etching. In various examples, the deposition includes CVD, physical vapor deposition (PVD), atomic layer deposition (ALD), thermal oxidation, other suitable techniques, or a combination thereof. The etching process includes dry etching, wet etching, and/or other etching methods (e.g., reactive ion etching). In the present embodiment, the dummy gate stack 310 is formed with a vertical profile.

Referring again to FIGS. 1 and 3A-3B, the method 100 proceeds to step 106 by forming spacers 320 along sidewalls of the dummy gate stack 310. In one embodiment, a formation of the spacer 320 includes depositing a spacer material layer on the substrate 210 and the dummy gate stack 310, and thereafter performing an anisotropic etch to the spacer material layer, thereby forming the spacer 320. The spacer material layer may include a dielectric material (such as silicon oxide, silicon nitride or silicon carbide) but is different from the material of the dummy gate stack 310 to achieve etching selectivity during a subsequent etch process. The deposition of the spacer material layer includes a suitable technique, such as CVD, PVD and/or ALD. The anisotropic etch may include a plasma etch in one example. In the present embodiment, the spacer 320 is formed with a vertical profile.

Figure 4:
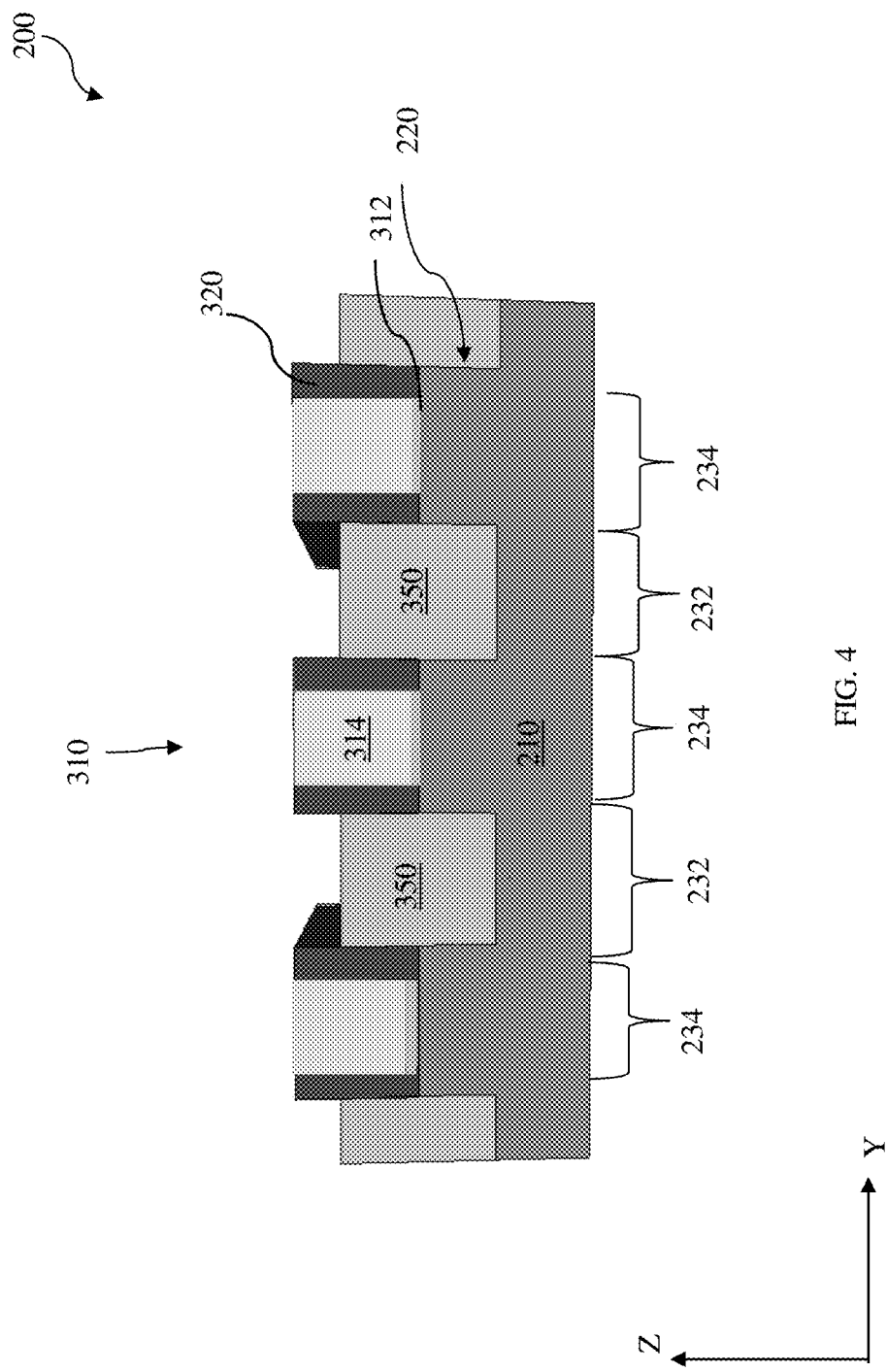
FIGS. 4 and 5 are cross-sectional views of an example FinFET device along the line B-B in FIG. 3A.

Referring to FIGS. 1 and 4, the method 100 proceeds to step 108 by forming source/drain features 350 in the S/D region 232. In one embodiment, the fin features 220 in the S/D region 232 are recessed by a selective etch process. Then the S/D features 350 are formed over the recessed fin feature 220 by epitaxial growing processes, such as CVD, VPE and/or UHV-CVD, molecular beam epitaxy, and/or other suitable processes. The S/D features 350 may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials.

Figure 5:
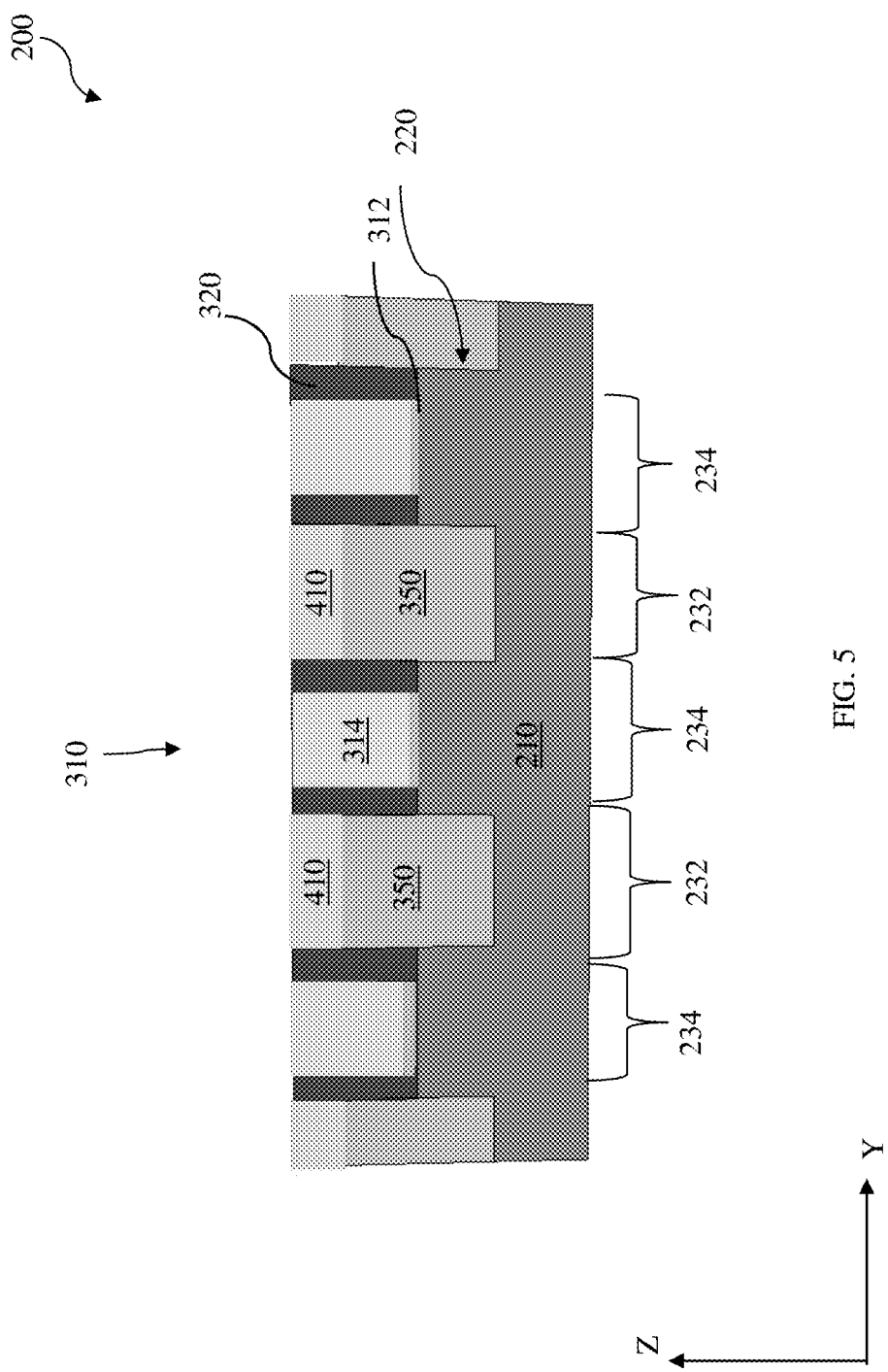

Referring to FIGS. 1 and 5, the method 100 proceeds to step 110 by depositing a first dielectric layer 410 over the substrate 210, including fully filling spaces between dummy gate stacks 310. The first dielectric layer 410 may include silicon oxide, silicon oxynitride, silicon nitride, silicon carbide, silicon carbide nitride, low k dielectric material or other suitable dielectric materials. The first dielectric layer 410 is formed by a suitable technique, such as CVD, ALD and spin-on (SOG). A chemical mechanical polishing (CMP) process may be performed thereafter to remove excessive dielectric layer 410 and planarize the top surface of the first dielectric layer 410 with the dummy gate stacks 310. In one embodiment, top surfaces of the dummy gate stack 310 are exposed after the CMP process.

Figure 6:
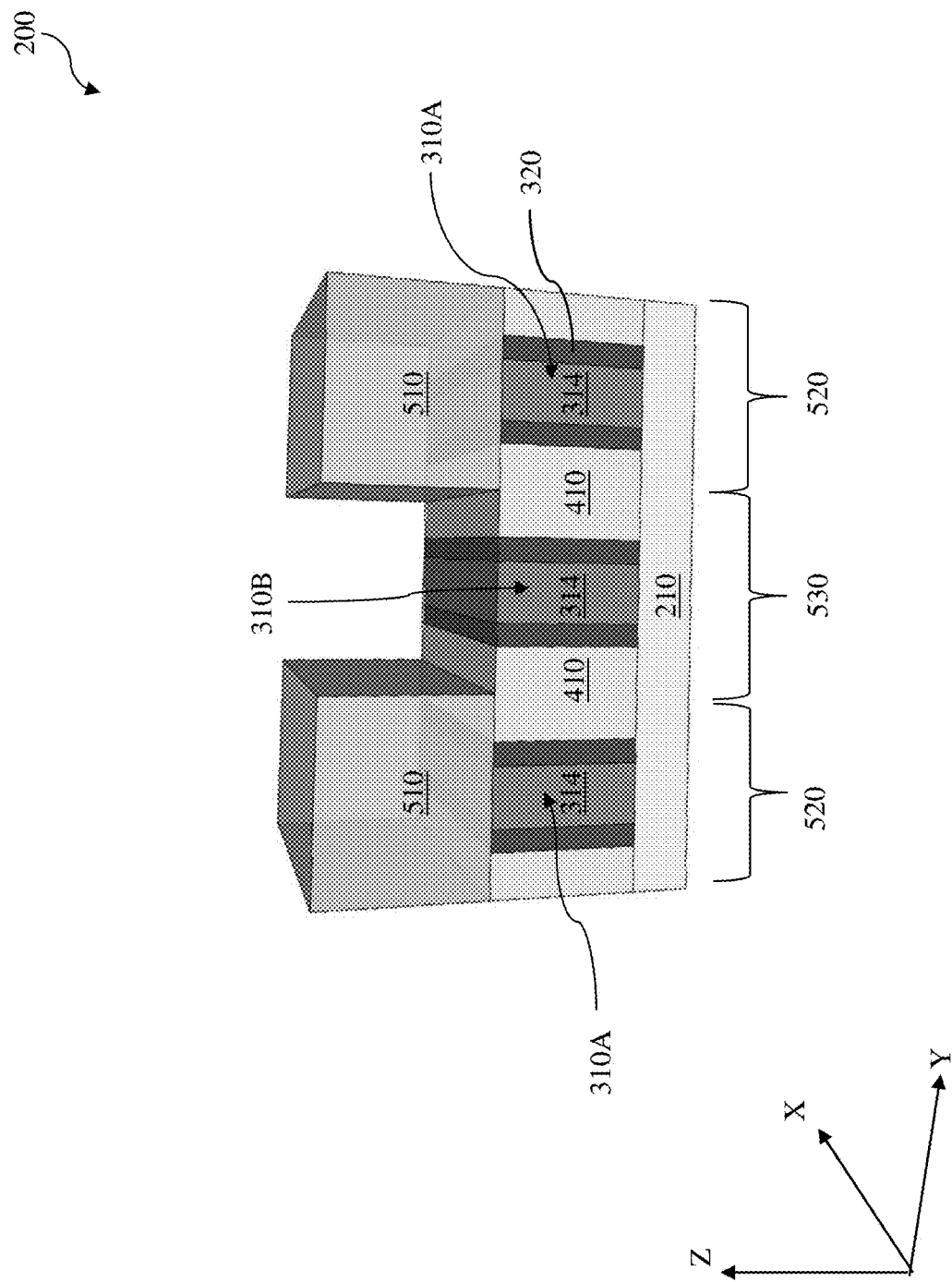
FIGS. 6, 7 and 8A are diagrammatic perspective views of an example FinFET device in accordance with some embodiments.

Referring to FIGS. 1 and 6, the method 100 proceeds to step 112 by forming a patterned hard mask (HM) 510 over the first dielectric layer 410 and the dummy gate stack 310 to define a first region 520 and a second region 530. The patterned HM 510 covers the first region 520 and leave the second region 530 be uncovered. For the sake of clarity to better describing the method 100, dummy gate stacks 310 in the first region 520 and second region 530 are now labeled with the reference number 310A and 310B, respectively. In one embodiment, the patterned HM 510 includes a patterned photoresist layer formed by a lithography process.

Figure 7:
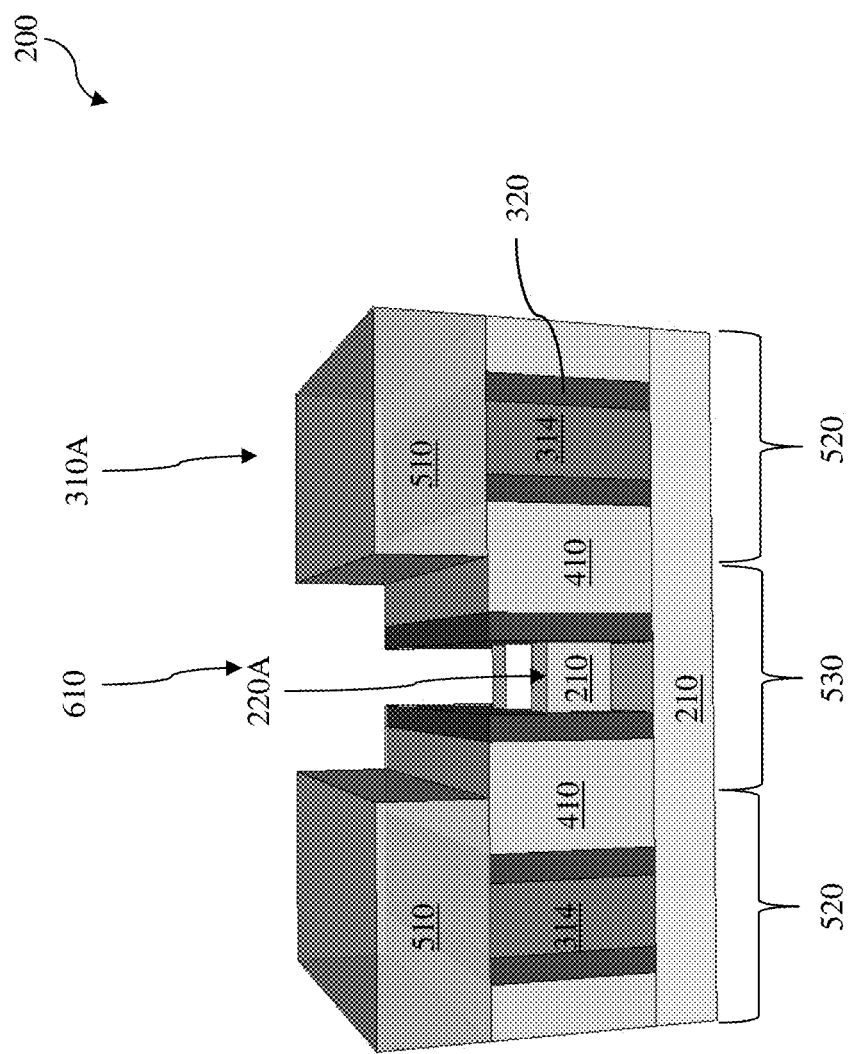

Referring to FIGS. 1 and 7, the method 100 proceeds to step 114 by removing dummy gate stack 310B to from a dummy gate trench 610 in the second region 530. In the present embodiment, the dummy gate stack 310B is removed by a selective etch process, including a selective wet etch or a selective dry etch, and carries vertical profile of the spacer 320. With the selective etch process, the dummy gate trench 610 is formed with a self-alignment nature, which relaxes process constrains, such as misalignment, and/or overlay issue in lithograph process, trench profile controlling in etch process, pattern loading effect, and etch process window.

In one embodiment, the wet etching solution includes a tetramethylammonium hydroxide (TMAH), a $HF/HNO_3/CH_3COOH$ solution, $NH_4OH$, KOH (potassium hydroxide), HF (hydrofluoric acid), or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the dummy gate trench 610, a respective portion of the fin feature 220 is exposed. For the sake of clarity to better describing the method 100, the first exposed portion of the fin feature 220 is labeled with the reference number 220A.

Figure 8A:
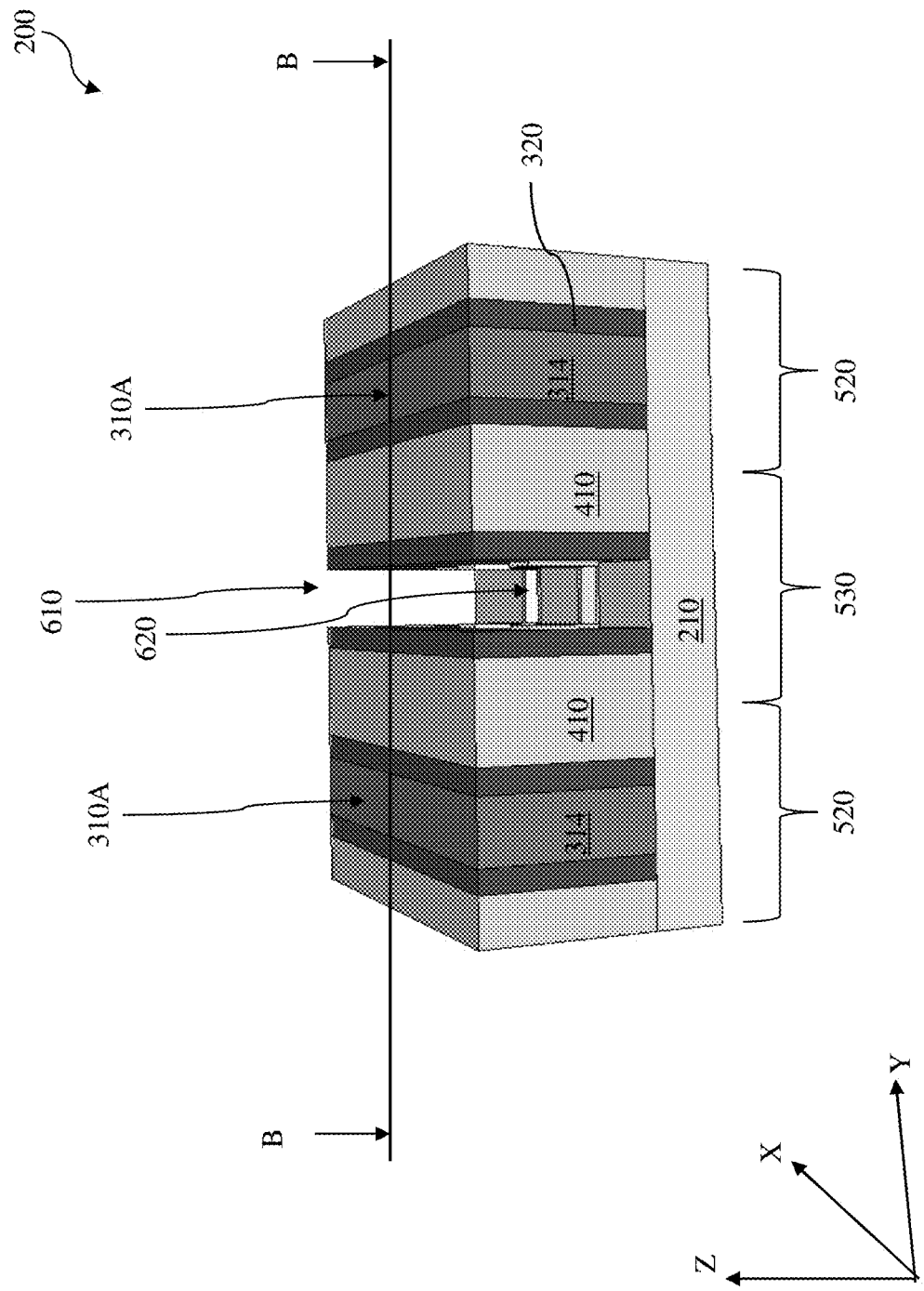
Figure 8B:
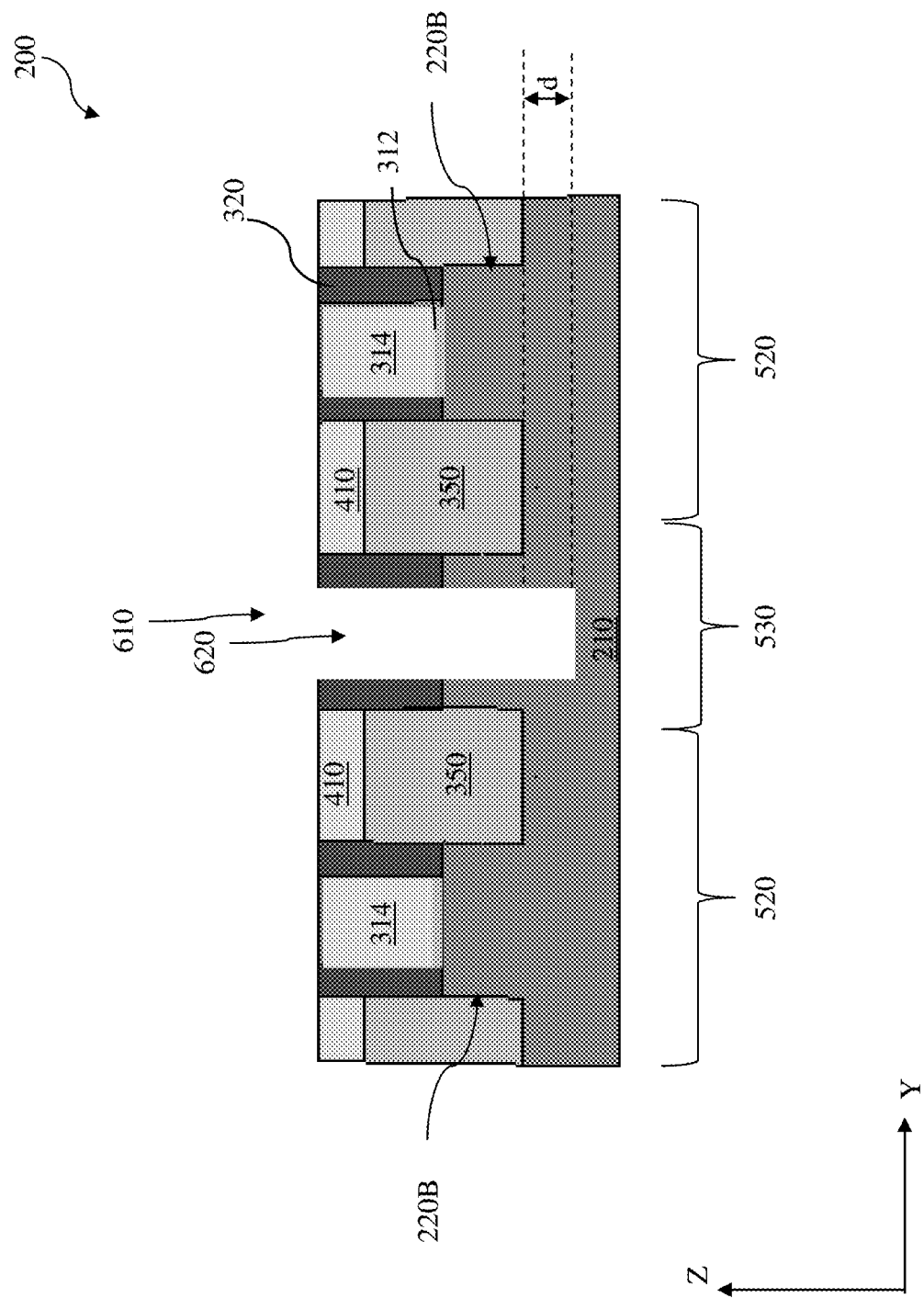
FIG. 8B is a cross-sectional view of an example FinFET device along the line B-B in FIG. 8A.

Referring to FIGS. 1 and 8A-8B, the method 100 proceeds to step 116 by removing the exposed fin feature 220A to form a fin cut 620 in the first dummy gate trench 610. Therefore the fin feature 220 is divided into more than one subset portions, referred to as fin feature 220B, and they are separated by the fin cut 620. The fin cut 620 is formed with a vertical profile. In one embodiment, the fin cut 620 extends to the substrate 210 with a depth d. In the present embodiment, the exposed portion 220A is removed by a selective etch process. The etch process selectively removes the exposed portion 220A but substantially does not etch the spacer 320 and the dielectric layer 410 in the second region 530. Therefore the fin cut 620 is formed with a self-alignment nature, which relaxes constrains of fin cut formation processes, which relaxes process constrains, such as misalignment, overlay issue in lithograph process, etch profile control and pattern loading effect. Also with a selective etch nature, etch process window is improved. In one example where the patterned HM 510 is a resist pattern, the patterned HM 510 is removed thereafter by wet stripping or plasma ashing.

Figure 9A:
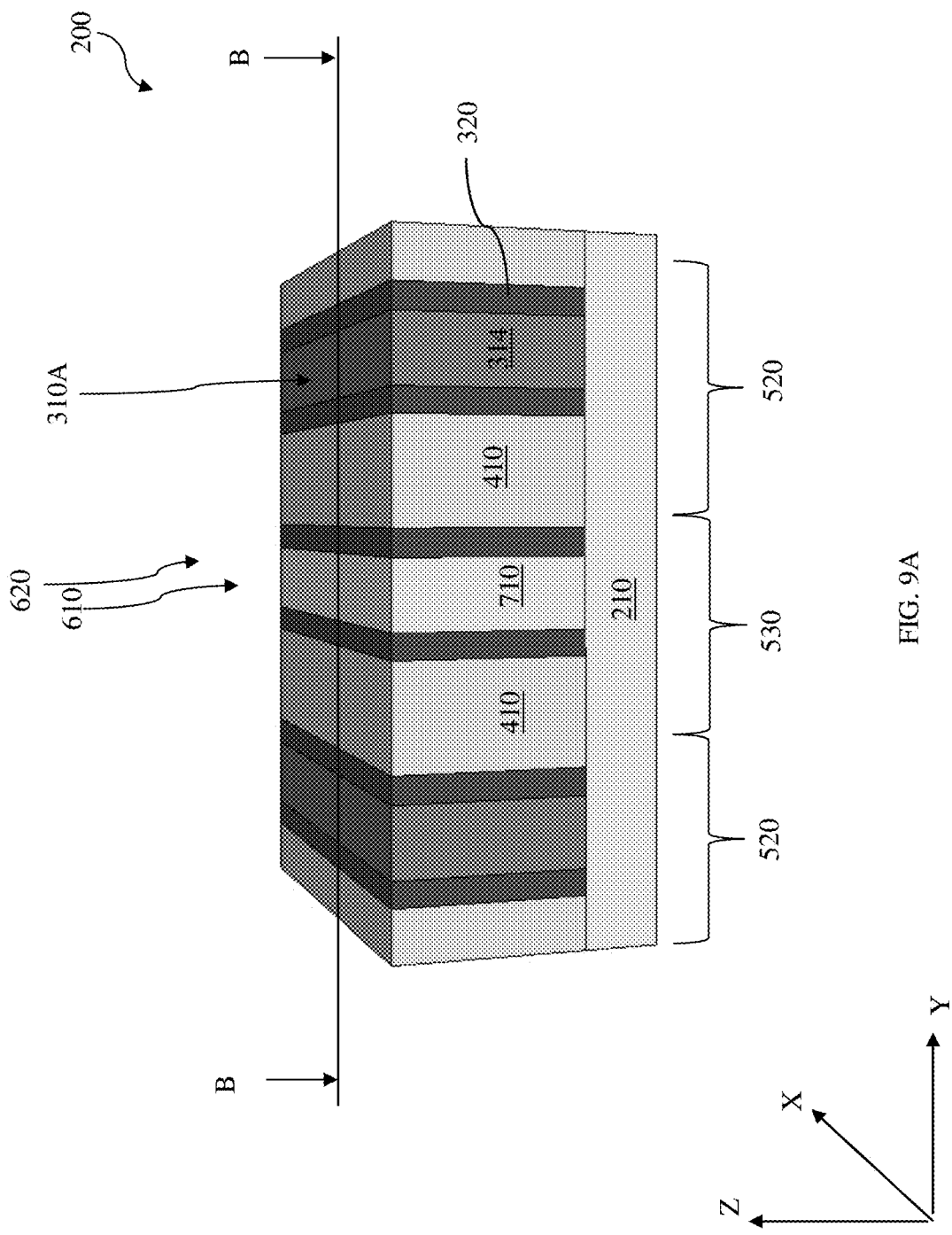
FIG. 9A is a diagrammatic perspective view of an example FinFET device in accordance with some embodiments.
Figure 9B:
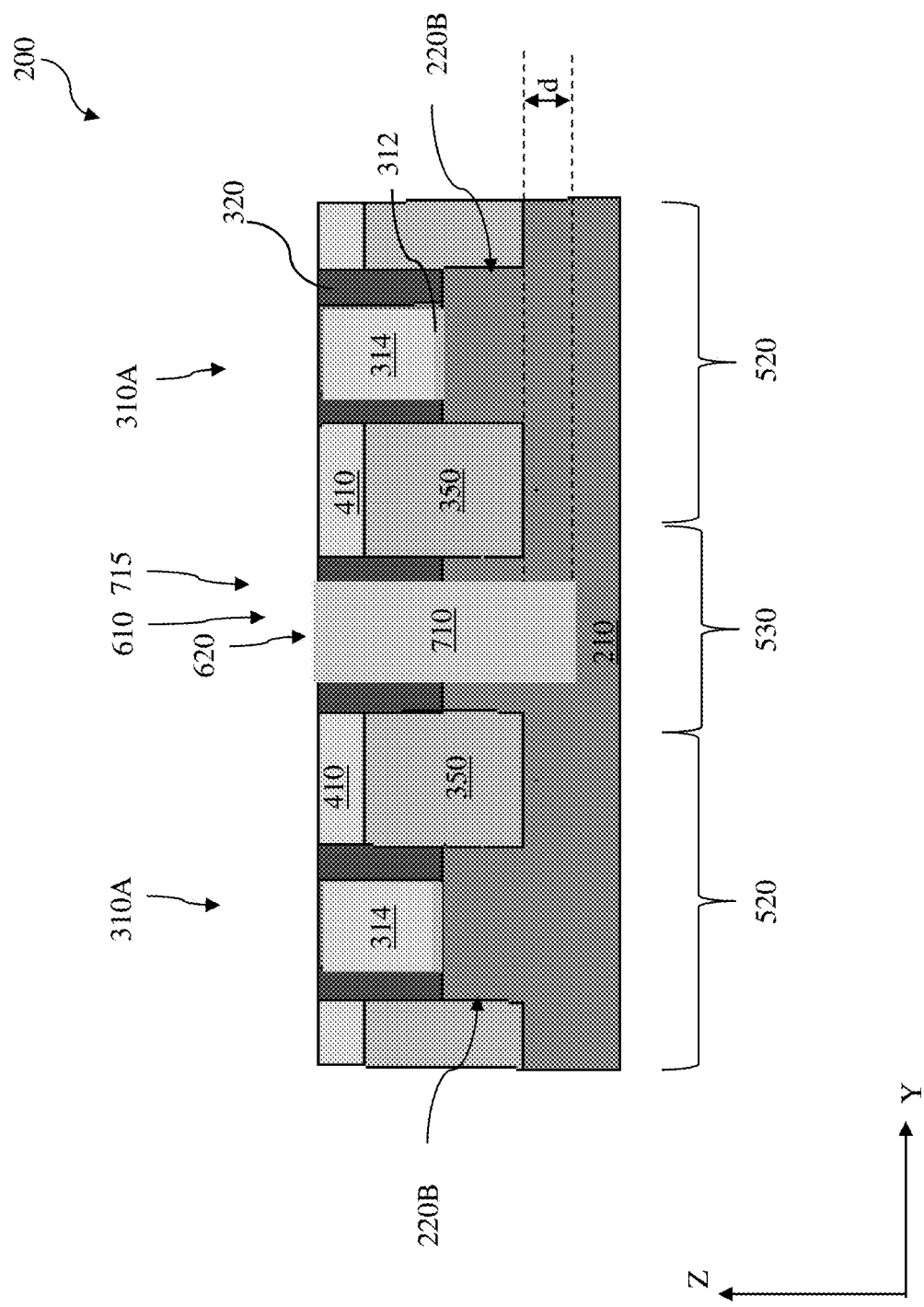
FIG. 9B is a cross-sectional view of an example FinFET device along the line B-B in FIG. 9A.

Referring to FIGS. 1 and 9A-9B, the method 100 proceeds to step 118 by forming isolation features 715 in the dummy gate trenches 610, including the fin cut 620. The isolation feature 715 isolates two adjacent fin features 220B to each other. The isolation feature 715 is formed by filling in the dummy gate trench 610 and the fin cut 620 with a second dielectric layer 710. Therefore, a bottom of the isolation feature 715 is embedded in the substrate 210 and physically contacts to the substrate 210. The second dielectric layer 710 may include silicon oxide, silicon oxynitride, silicon nitride, silicon carbide, silicon carbide nitride, low k dielectric material and/or other suitable dielectric materials. The second dielectric layer 710 may be formed by a suitable technique, such as CVD, ALD and spin-on coating. The second dielectric layer 710 carries the vertical profile of the dummy gate trench 610 and the fin cut 620. A CMP process may be performed thereafter to remove excessive the second dielectric layer 710 and planarize the top surface of the second dielectric layer 710 with the dummy gate stack 310.

Figure 10:
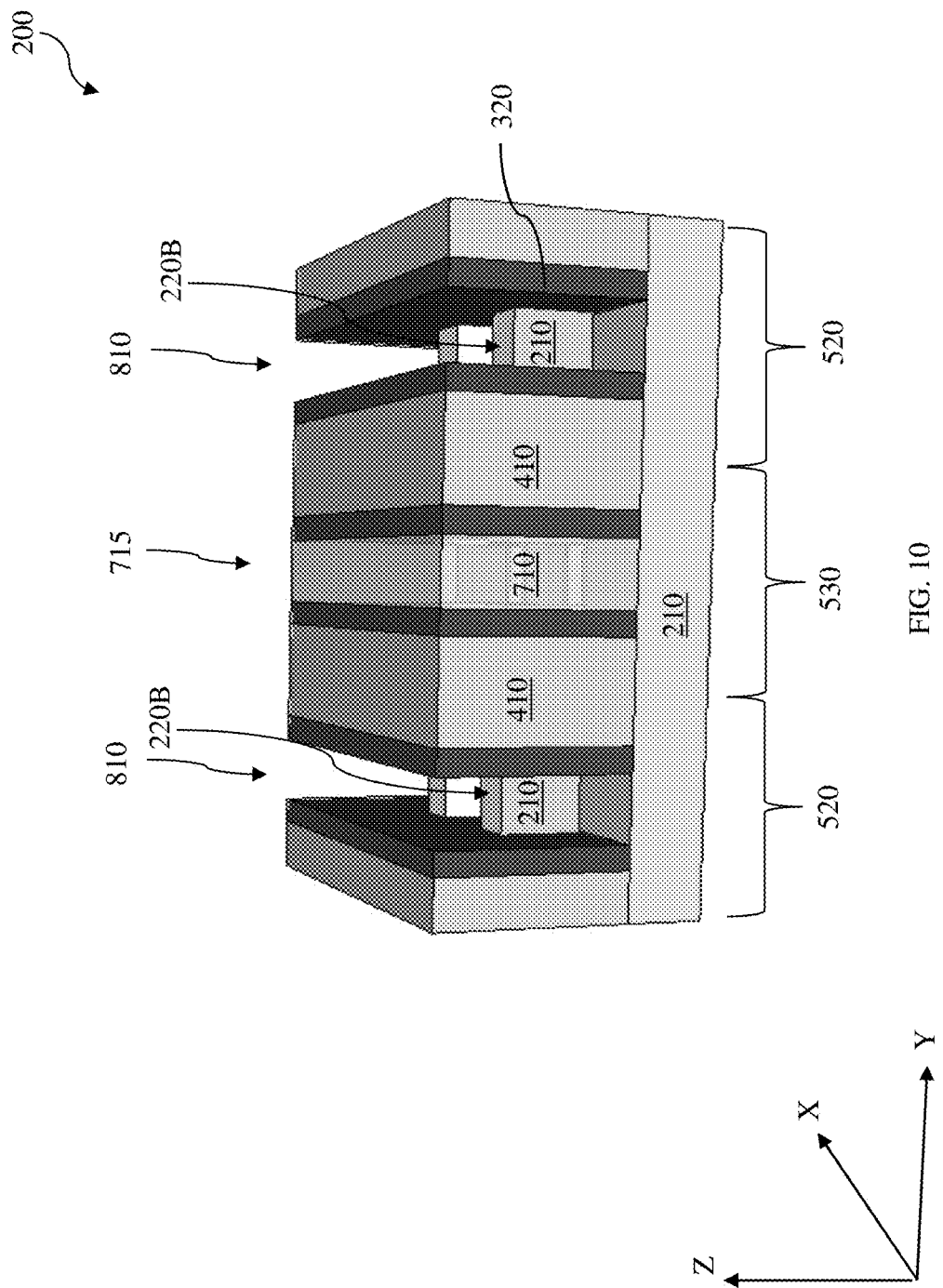
FIGS. 10 and 11A are diagrammatic perspective views of an example FinFET device in accordance with some embodiments.

Referring to FIGS. 1 and 10, the method 100 proceeds to step 120 by removing dummy gate stack 310A to form gate trenches 810 in the first region 520. The dummy gate stack 310A are removed similarly in many respects to the removing the dummy gate stack 310B discussed above in association with FIG. 7. In the present embodiment, the dummy gate stacks 310A are removed by a selective etch process without using a patterned hard mask, or referring as a blank etch, which provide a quite simple process. The selective etch process may include a selective wet etch or a selective dry etch. The etch process selectively removes the dummy gate stack 310A but substantially does not etch the spacers 320, the first dielectric layer 410 and the second dielectric layer 710. Respective fin features 220B are exposed in the gate trench 810.

Figure 11A:
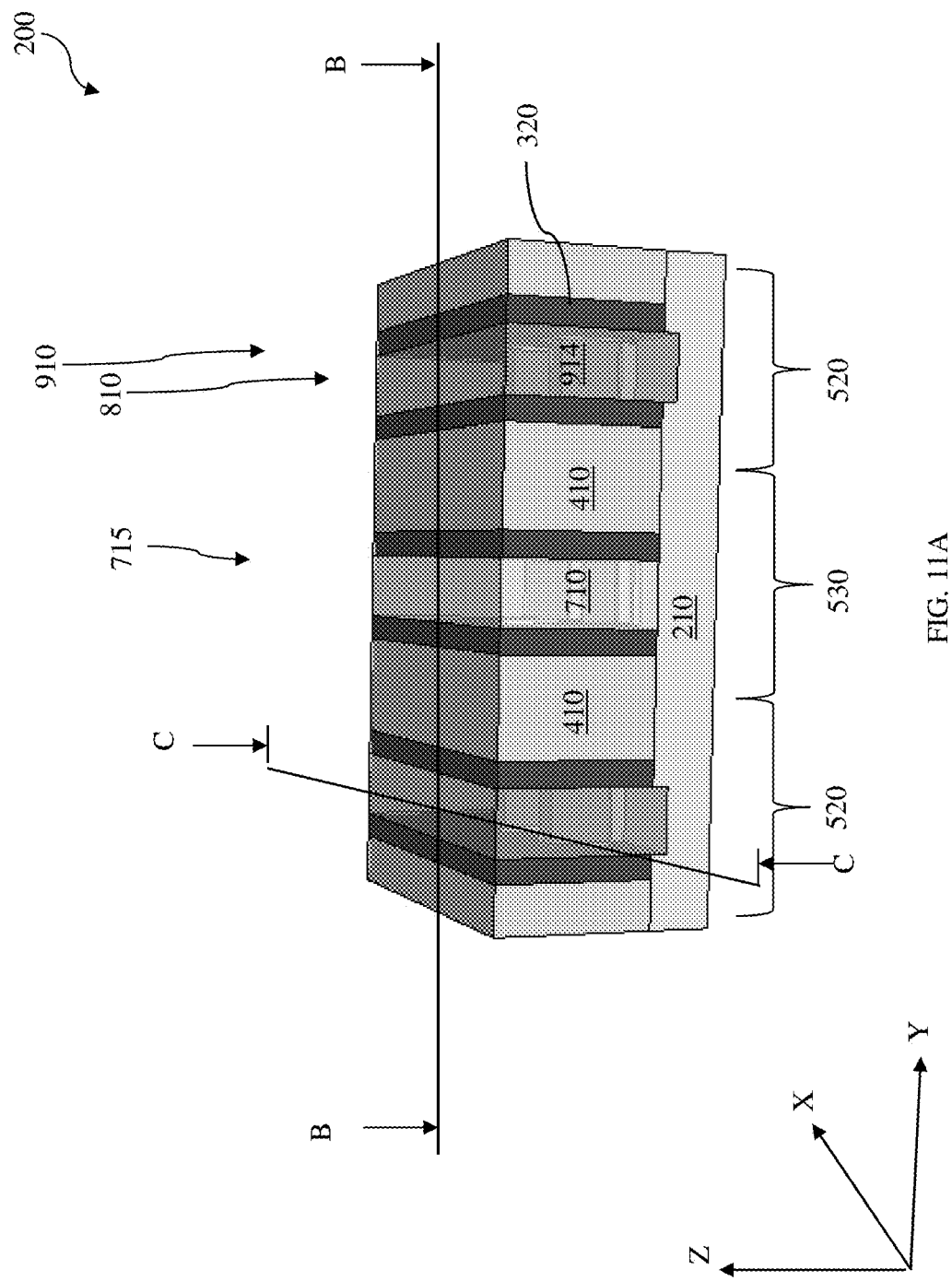
Figure 11B:
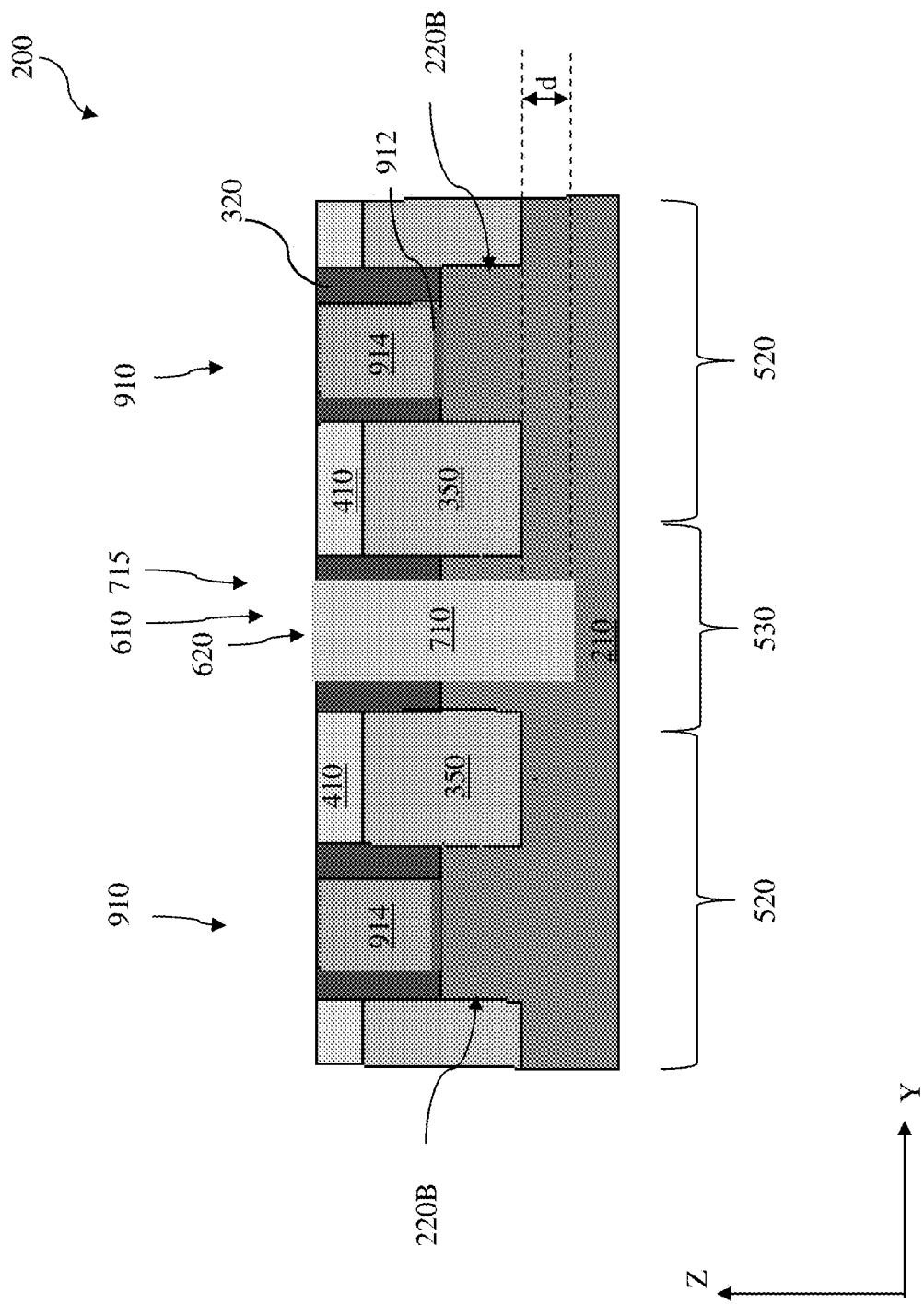
FIG. 11B is a cross-sectional view of an example FinFET device along the line B-B in FIG. 11A.
Figure 11C:
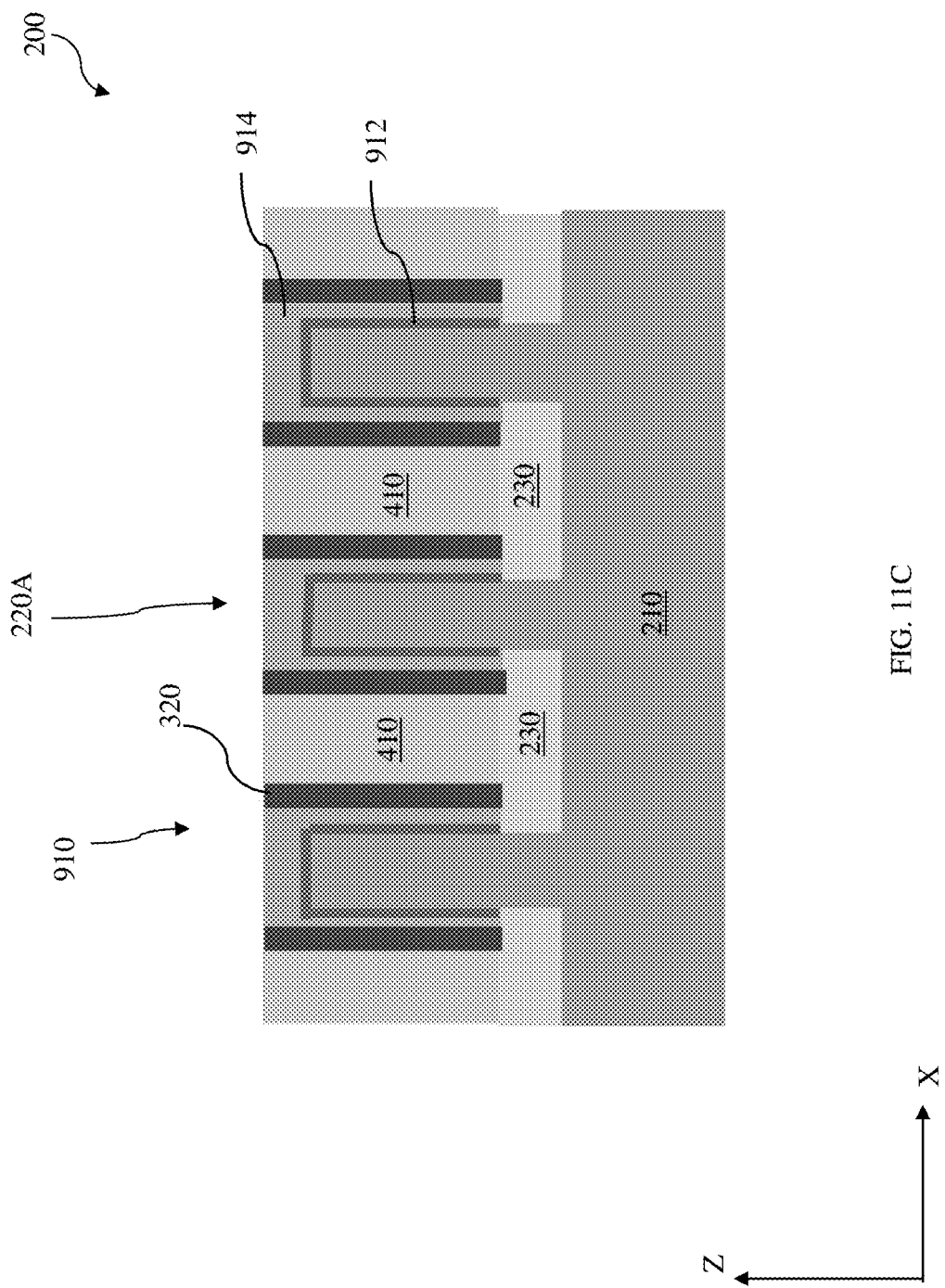
FIG. 11C is a cross-sectional view of an example FinFET device along the line C-C in FIG. 11A.

Referring to FIGS. 1 and 11A-11C, the method 100 proceeds to step 122 by forming HK/MGs 910 over the substrate 210, including wrapping over the fin feature 220B. Here FIG. 11B is a cross-section view along the line B-B and FIG. 11C is a cross-section view along a line C-C. The HK/MG 910 may include gate dielectric layer and gate electrode disposed over the gate dielectric and the gate electrode includes metal, metal alloy or metal silicide. The formation of the HK/MG 910 includes depositions to form various gate materials and a CMP process to remove the excessive gate materials and planarize the top surface of the FinFET device 200.

Referring again to FIGS. 11B-11C, in one embodiment, the gate dielectric layer 912 includes an interfacial layer (IL) is deposited by a suitable method, such as atomic layer deposition (ALD), CVD, thermal oxidation or ozone oxidation. The IL includes oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr)$TiO_3$ (BST), $Al_2O_3$, $Si_3N_4$, oxynitrides (SiON), or other suitable materials.

The gate dielectric layer 912 wraps over the fin feature 220B in a gate region, where a gate channel will be formed during operating the FinFET device 200. Therefore two adjacent gate channels (formed over the two adjacent fin features 220B) are isolated to each other by the isolation feature 715.

A metal gate (MG) electrode 914 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 914 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 914 may be formed by ALD, PVD, CVD, or other suitable process. The MG electrode 914 may be formed separately for the N-FET and P-FFET with different metal layers. A CMP process may be performed to remove excessive MG electrode 914.

Additional steps can be provided before, during, and after the method 1000, and some of the steps described can be replaced or eliminated for other embodiments of the method.

Figure 12:
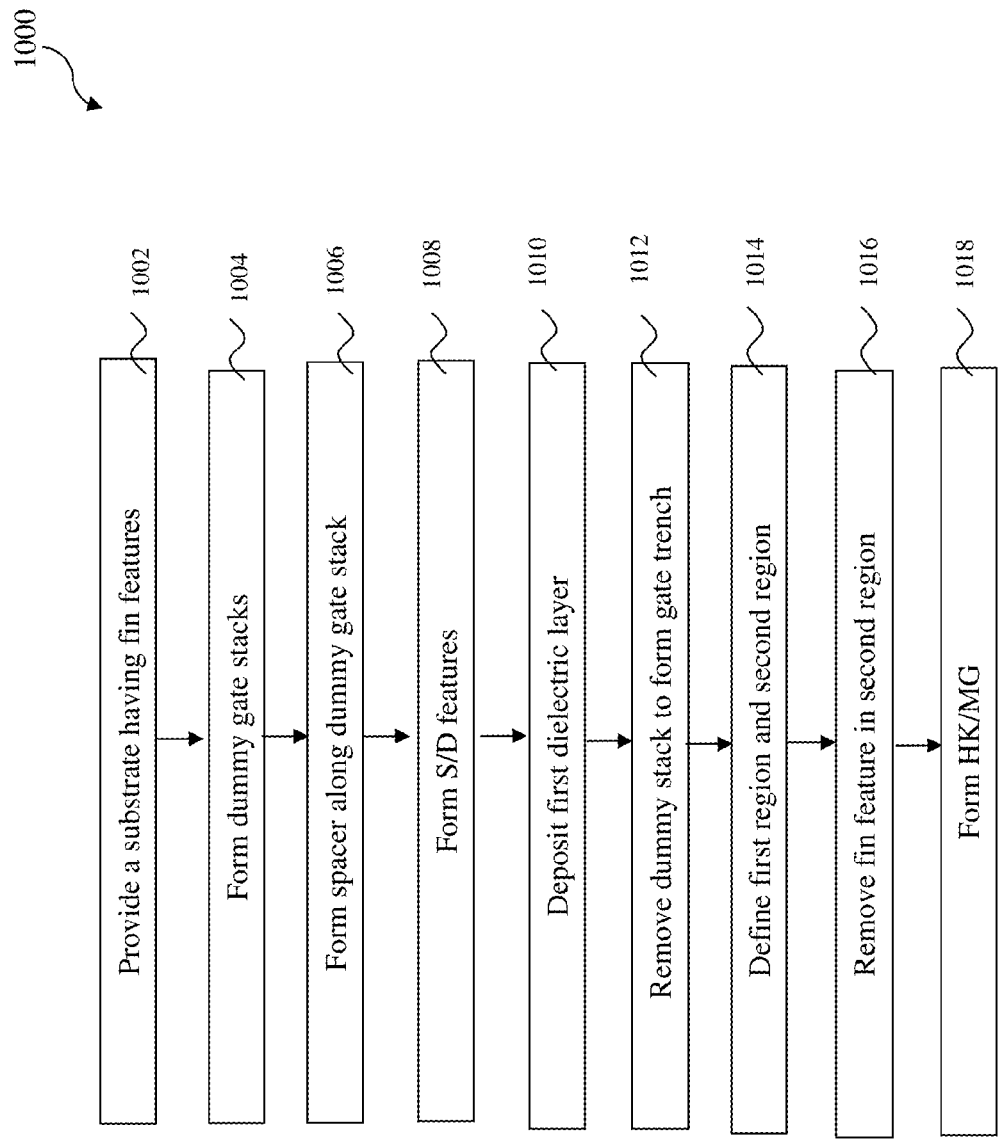
FIG. 12 is a flow chart of an example method for fabricating a FinFET device in accordance with some embodiments.

FIG. 12 is a flowchart of another example method 1000 for fabricating a FinFET device 2000. The first four steps of the method 1002, 1004, 1006, 1008 and 1010 are similar to those discussed above in steps 102, 104, 106, 108 and 110 respectively, of the method 100. Thus, the discussion above with respect to steps 102, 104, 106, 108 and 110 is applicable to the steps 1000, 1002, 1004, 1008 and 1010, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 13:
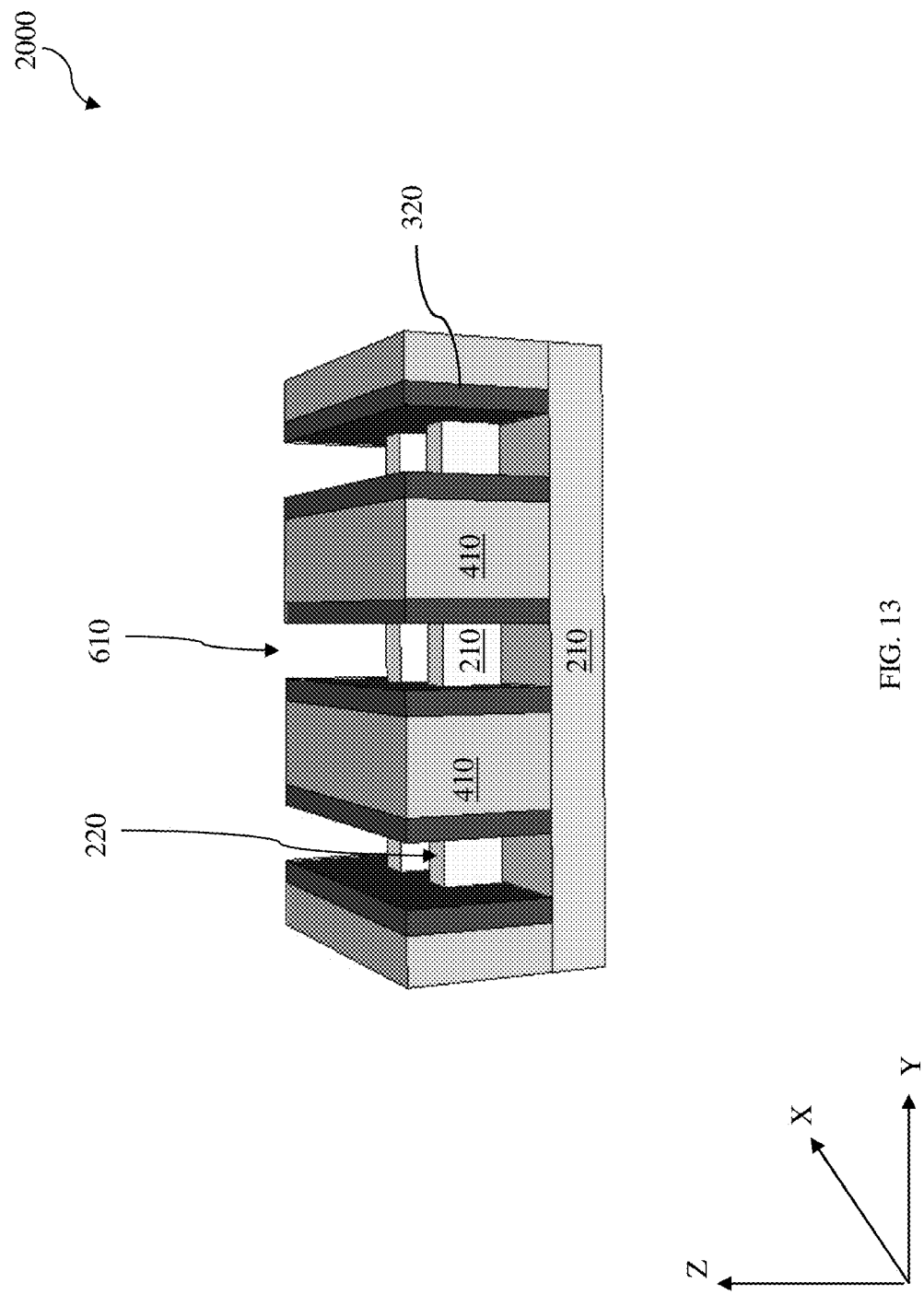

Referring to FIGS. 12 and 13, the method 1000 proceeds to step 1012 by removing dummy gate stacks 310 to from the dummy gate trench 610 over the substrate 210. In the present embodiment, the dummy gate stacks 310 are removed by a selective etch process without using a patterned hard mask, or referring as a blank etch, which provide a quite simple process. The etch process of removing dummy gate stack 310 is similar in many respects to those discussed above in step 112 of the method 100. The fin features 220 are exposed in the dummy gate trenches 610.

Figure 14:
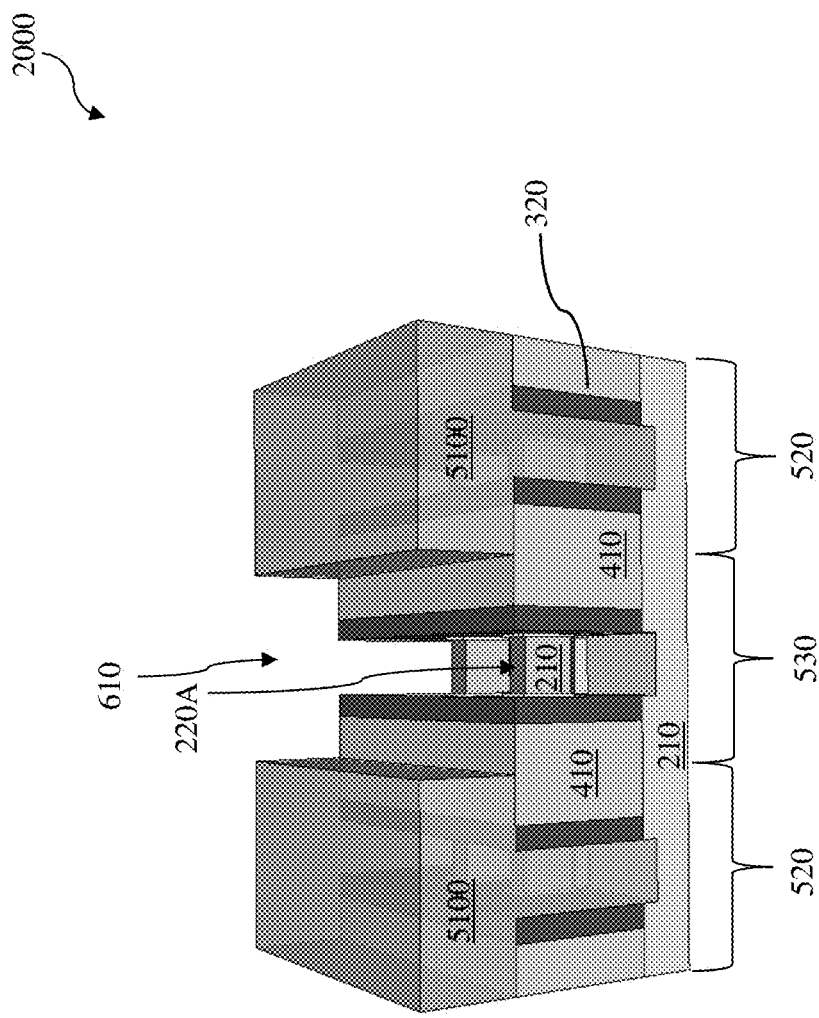

Referring to FIGS. 11 and 14, the method 1000 proceeds to step 1014 by forming the patterned HM 5100 to define the first region 520 and the second region 530. The patterned HM 5100 covers the first region 520 and leave the second region 530 be un-covered. The patterned HM 5100 is formed similarly in many respects to the patterned HM 510 discussed above in step 112 of the method 100. The fin feature 220A is exposed in the dummy gate trench 610 in the second region 530.

Figure 15:
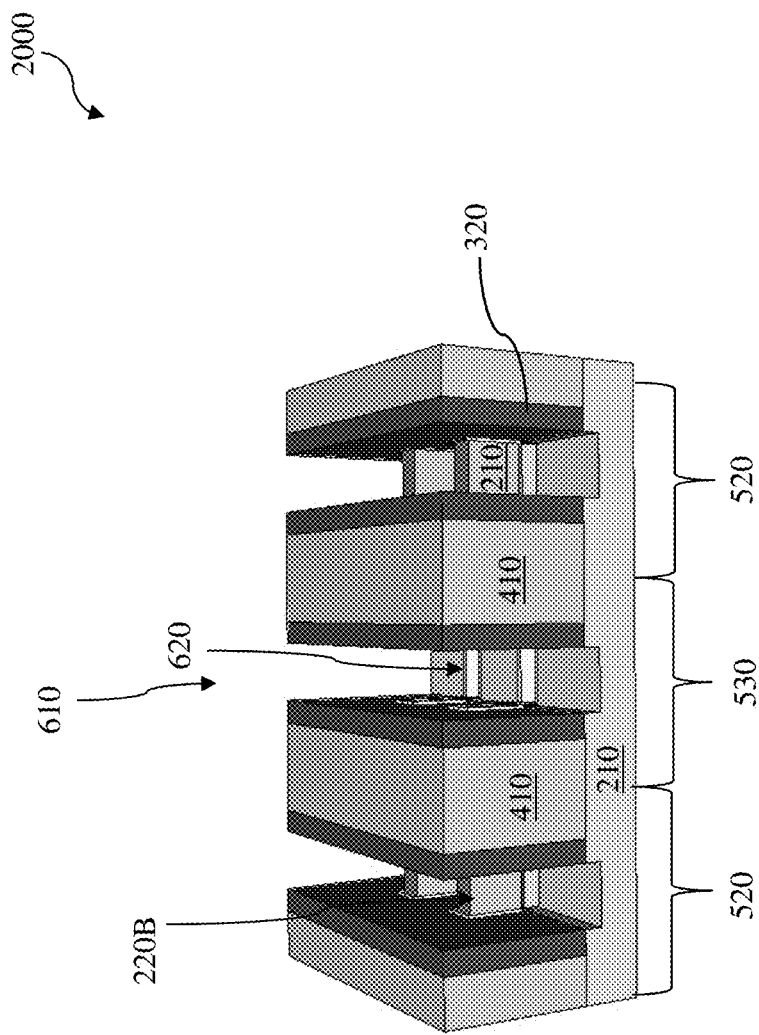
Figure 16A:
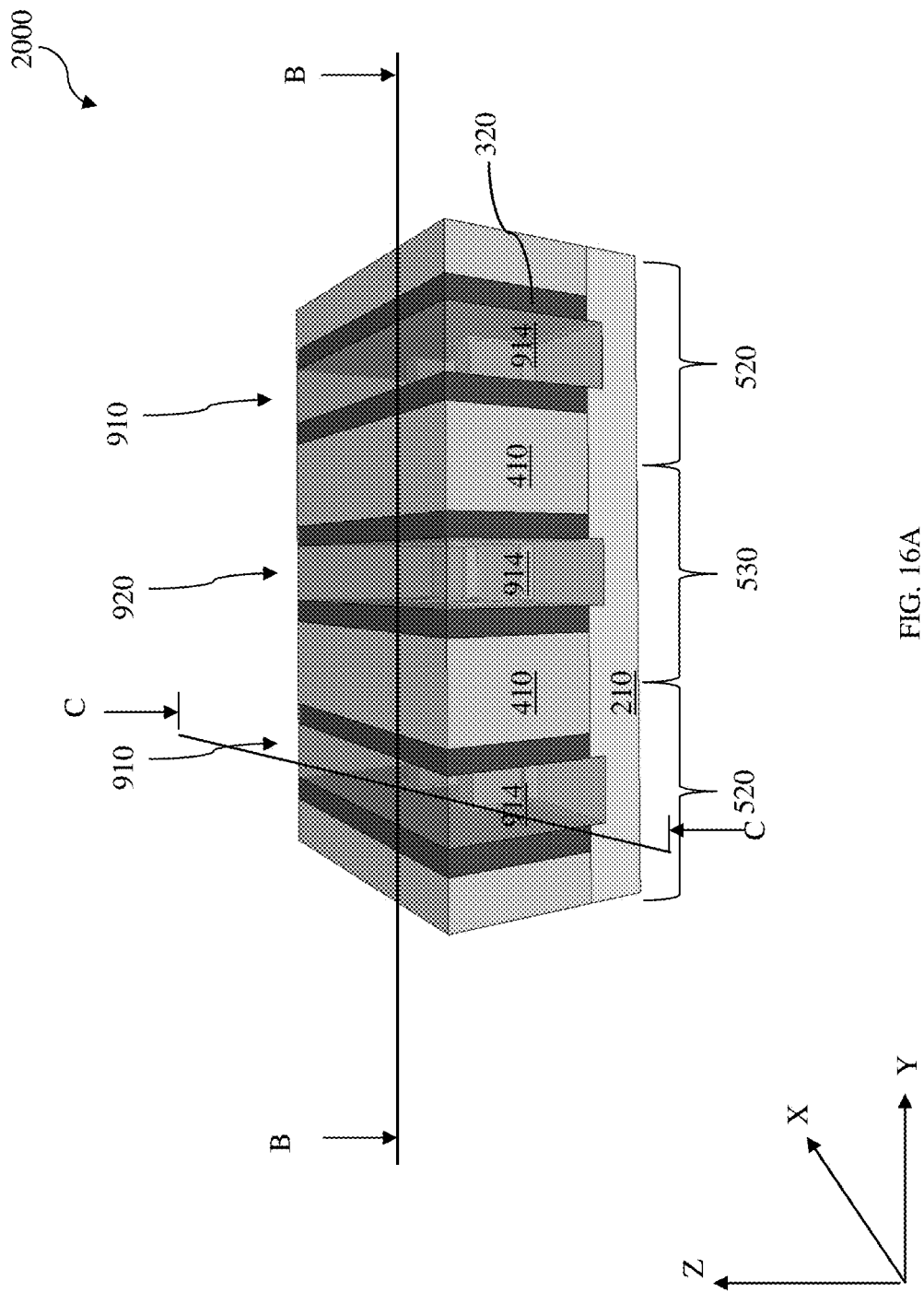
Figure 16B:
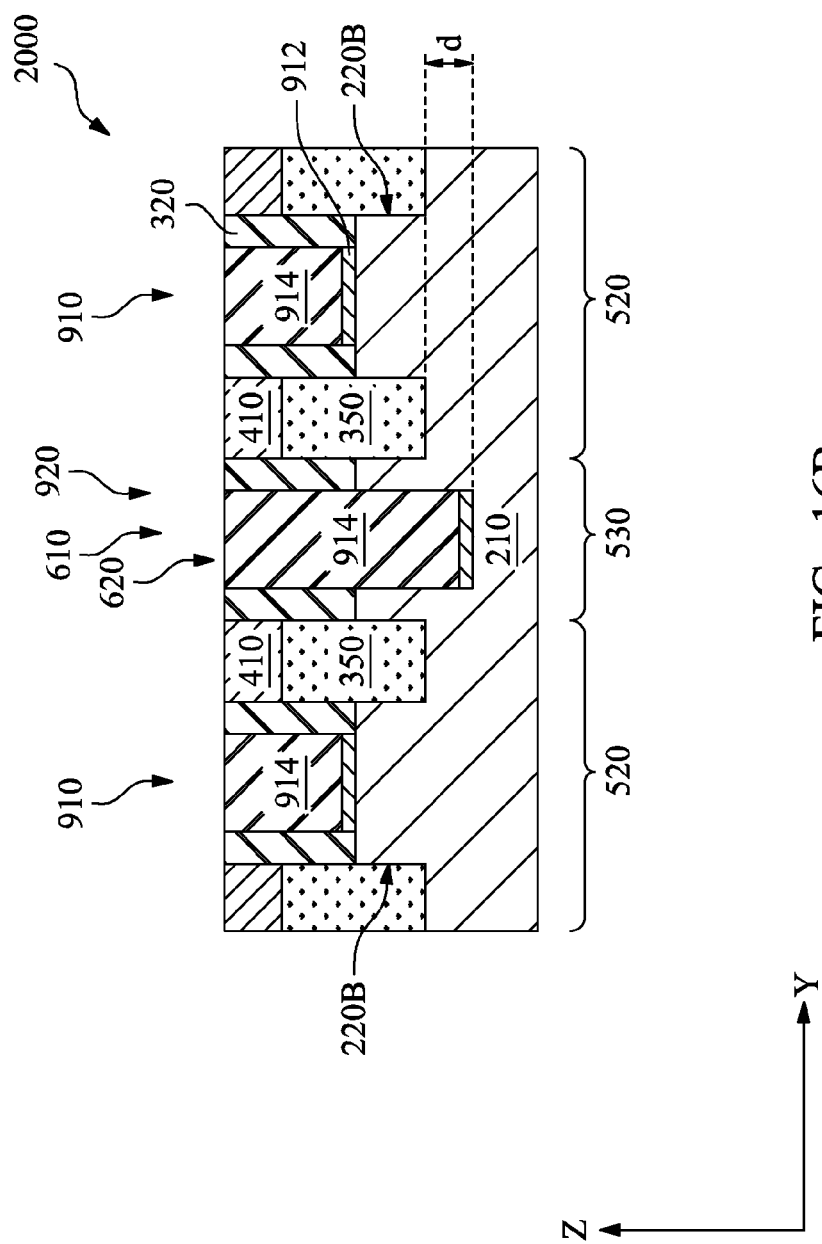
FIG. 16B is a cross-sectional view of an example FinFET device along the line B-B in FIG. 16A.
Figure 16C:
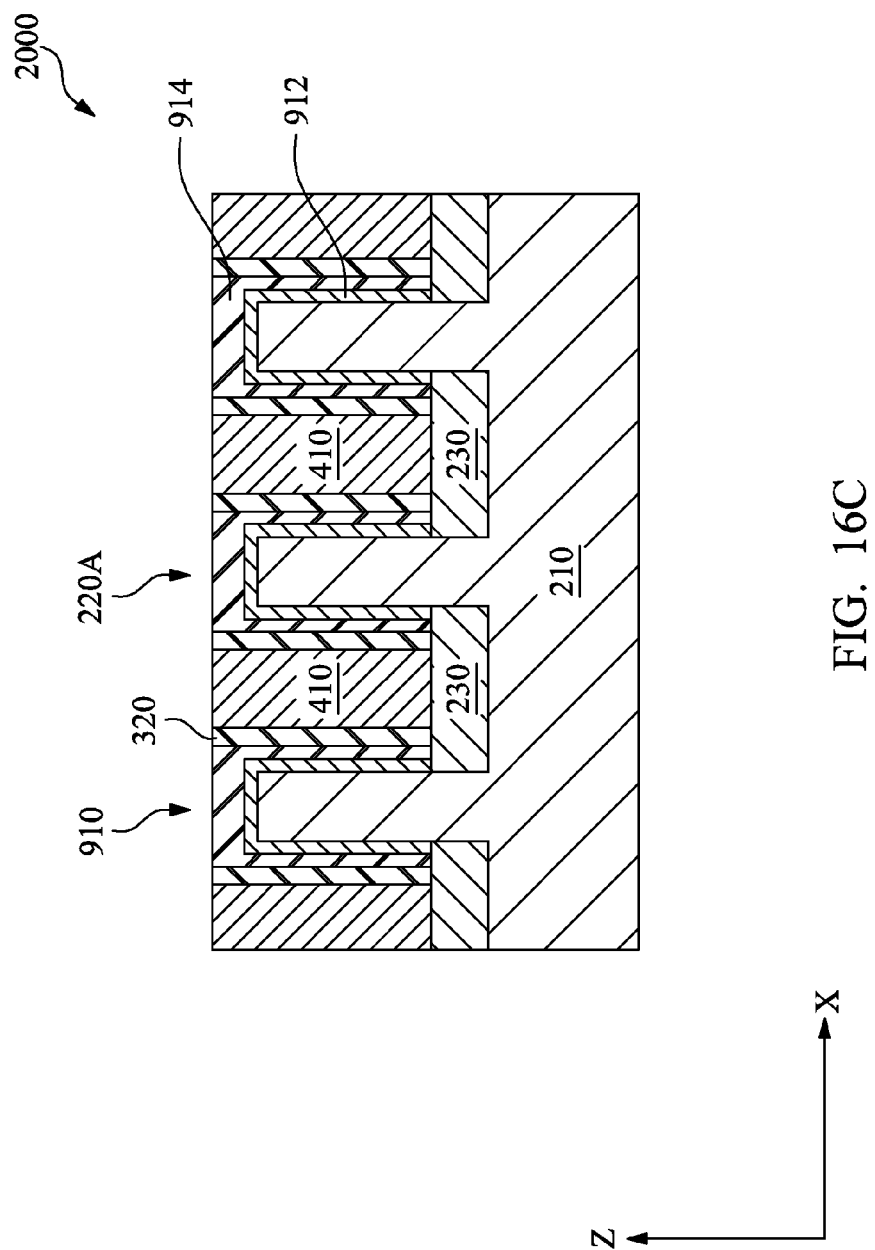
FIG. 16C is a cross-sectional view of an example FinFET device along the line C-C in FIG. 16A.

Referring to FIGS. 11 and 15, the method 1000 proceeds to step 1016 by removing the fin feature 220A to form the fin cut 610 while covering the first region 520 with the patterned HM 5100. The fin cut 610 is formed similarly in many respects to those discussed above in step 116 of the method 100. In one example where the patterned HM 5100 is a photoresist pattern, the patterned HM 5100 is removed thereafter by wet stripping or plasma ashing. Same as mentioned in step 116, by forming the fin cut 620, two adjacent fin features 220B are separated to each other.

Referring to FIGS. 11 and 16A-16C, the method 1000 proceeds to step 1018 by forming the HK/MG 910 in the first region 520, including wrapping over the fin feature 220B, and a HK/metal feature 920 in the dummy gate trench 610, as well as the fin cut 620. The HK/MG 910 and the HK/metal feature 920 are formed similarly in many respects to those discussed above in step 122 of the method 100. In the present embodiment, the HK/metal feature 920 separates two adjacent fin features 220B to each other. The HK/metal feature 920 is formed by filling in the dummy gate trench 610 and the fin cut 620 with the gate dielectric layer 912 and the gate electrode 914. Therefore, a bottom of the HK/metal feature 920 is embedded in the substrate 210 and physically contacts to the substrate 210.

Additional steps can be provided before, during, and after the method 100, and some of the steps described can be replaced or eliminated for other embodiments of the method.

The FinFET devices 200 and 2000 undergo further CMOS or MOS technology processing to form various features and regions. For example, the FinFET devices 200 and 2000 may include various contacts/vias/lines and multilayers interconnect features (e.g., metal layers and interlayer dielectrics) over the substrate 210. As an example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers a method for fabricating a FinFET device. The method employs forming fin cut with self-alignment nature, which relaxes process constrains, improves process window and process control and provides process simplicity.

The present disclosure provides many different embodiments of fabricating a FinFET device that provide one or more improvements over existing approaches. In one embodiment, a method for fabricating a FinFET device includes forming a first gate stack and a second gate stack over different portions of a fin feature formed on a substrate, forming a first dielectric layer in a space between the first and second gat stacks, removing the first gate stack to form a first gate trench, therefore the first gate trench exposes a portion of the fin feature. The method also includes removing the exposed portion of the fin feature and forming an isolation feature in the first gate trench.

In another embodiment, a method for fabricating a FinFET device includes forming first gate stacks over different portions of a fin feature formed on a substrate, forming spacers along sidewalls of the first gate stacks, filling in spaces between two adjacent first gate stacks with a dielectric layer, removing the first gate stacks to form gate trenches, wherein the respective portions of the fin feature are exposed in the gate trenches, removing the exposed portion of the fin feature in a first region while remaining the exposed portion of the fin feature in a second region, forming second gate stacks over the exposed portions of the fin feature in the second region and at same time, forming a gate stack feature in the gate trench in the first region.

The present disclosure also provides an embodiment of a FinFET device. The device includes a first portion of a fin feature and a second portion of the fin feature disposed over a substrate. The first portion aligns with the second portion along a line in a first direction. The device also includes an isolation feature separates the first portion and the second portion of the fin feature, such that the bottom surface of the isolation feature is embedded in the substrate. The device also includes a high-k/metal gate (HK/MG) wrapping over a portion of the first fin feature and a portion of the second fin feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first gate stack and a second gate stack over different portions of a fin feature formed on a substrate;
forming a first dielectric layer in a space between the first and second gate stacks;
removing the first gate stack to form a first gate trench, wherein the first gate trench exposes a portion of the fin feature;
removing the exposed portion of the fin feature to form a fin cut; forming an isolation feature in the first gate trench and the fin cut; and after forming the isolation feature, removing the second gate stack to form a second gate trench, wherein the second gate trench exposes another portion of the fin feature; and forming a high-k/metal (HK/MG) gate stack in the second gate trench, and wherein the second gate stack is removed by a selective etch, which does not etch the first dielectric layer and the isolation feature, wherein the second gate stack is removed without using a patterned hard mask.

2. The method of claim 1, wherein after removing the exposed portion of the fin feature, the fin feature has a first portion that is separated from a second portion by the fin cut.

3. The method of claim 1, wherein removing the first gate stack includes:
covering the second gate stack with a patterned hard mask.

4. The method of claim 1, wherein the first gate stack is removed by a selective etch, which does not etch the first dielectric layer.

5. The method of claim 1, wherein the exposed portion of the fin feature is removed by a selective etch, which does not etch the first dielectric layer.

6. The method of claim 1, further comprising:
after forming the first gate stack, forming spacers along sidewalls of the first gate stack, wherein the first gate stack is removed by a selective etch, which does not etch the spacers, wherein the exposed portion of the fin feature is removed by the selective etch, which does not etch spacers.

7. The method of claim 1, wherein forming the isolation feature includes:
filling in the first gate trench and the fin cut with a second dielectric layer; and
applying chemical mechanical polishing (CMP) to remove excessive second dielectric layer.

8. The method of claim 1, wherein the forming of the first dielectric layer includes:
filling in the space between the first and second gate stacks with a dielectric material; and
applying CMP to remove excessive dielectric material and expose top surfaces of the first and second gate stacks.

9. A method comprising:
forming first, second, and third gate stacks over a fin feature formed on a substrate, wherein the first gate stack is between the second and third gate stacks;
forming a dielectric layer in spaces between the first, second, and third gate stacks;
removing the first gate stack to form a first gate trench, wherein the first gate trench exposes a first portion of the fin feature;
removing the first portion of the fin feature to form a fin cut; forming an isolation feature in the first gate trench and the fin cut; removing the second and third gate stacks to form second and third gate trenches exposing second and third portions of the fin feature; forming high-k/metal (HK/MG) gate stacks in the second and third gate trenches; and before the forming of the dielectric layer, forming gate spacers along sidewalls of the first, second, and third gate stacks.

10. The method of claim 9, further comprising:
before the removing of the first portion of the fin feature, forming a patterned hard mask covering the second and third portions of the fin feature.

11. A method comprising:
forming first, second, and third gate stacks over a fin feature formed on a substrate, wherein the first gate stack is between the second and third gate stacks;
forming gate spacers along sidewalls of the first, second, and third gate stacks;
forming a dielectric layer in spaces between the gate spacers;
removing the first gate stack to form a first gate trench, wherein the first gate trench exposes a first portion of the fin feature, wherein the removing of the first gate stack includes covering the second and third gate stacks with a patterned hard mask; removing the first portion of the fin feature to form a fin cut; forming an isolation feature in the first gate trench and the fin cut; removing the patterned hard mask; removing the second and third gate stacks to form second and third gate trenches exposing second and third portions of the fin feature; and forming final gate stacks in the second and third gate trenches.

* * * * *